United States Patent [19]

Lee

[11] Patent Number: 5,089,878
[45] Date of Patent: Feb. 18, 1992

[54] LOW IMPEDANCE PACKAGING

[76] Inventor: Jaesup N. Lee, 973 Campbell Ave., Los Altos, Calif. 94022

[21] Appl. No.: 364,370

[22] Filed: Jun. 9, 1989

[51] Int. Cl.$^5$ ...................... H01L 23/30; H01L 23/48
[52] U.S. Cl. ......................................... 357/71; 357/70
[58] Field of Search ............................. 357/70, 74, 72

[56] References Cited

U.S. PATENT DOCUMENTS

| 4,543,544 | 9/1985 | Ziegner | 333/34 |
| 4,551,747 | 11/1985 | Gilbert et al. | 361/414 |
| 4,594,641 | 6/1986 | Hernandez | 361/306 |
| 4,638,348 | 1/1987 | Brown et al. | 357/74 |
| 4,675,717 | 6/1987 | Herrero et al. | 357/71 R |
| 4,680,613 | 7/1987 | Daniels et al. | 357/72 |
| 4,680,617 | 7/1987 | Ross | 357/72 |
| 4,731,700 | 3/1988 | Woodward et al. | |
| 4,744,007 | 5/1988 | Watari et al. | |
| 4,754,366 | 6/1988 | Hernandez | 361/306 |
| 4,796,078 | 1/1989 | Phelps, Jr. et al. | |
| 4,801,765 | 1/1989 | Moyer et al. | 357/70 |
| 4,827,327 | 5/1989 | Miyauchi et al. | 357/74 |
| 4,827,377 | 5/1989 | Butt | 361/401 |
| 4,839,717 | 6/1989 | Phy et al. | 357/74 |
| 4,891,687 | 1/1990 | Mallik et al. | |

FOREIGN PATENT DOCUMENTS

| 0211618 | 2/1987 | European Pat. Off. | |
| 55-103747 | 8/1980 | Japan | |
| 0098543 | 6/1984 | Japan | 357/71 |
| 0092646 | 5/1985 | Japan | 357/70 |
| 60-180154 | 9/1985 | Japan | |
| 0012053 | 1/1986 | Japan | |
| 61-20343 | 1/1986 | Japan | |
| 61-208242 | 9/1986 | Japan | |
| 62-008544 | 1/1987 | Japan | |
| 62-035655 | 2/1987 | Japan | |
| 0054456 | 3/1987 | Japan | |
| 01-137660 | 5/1989 | Japan | |
| 2003321 | 3/1979 | United Kingdom | |
| 2160707 | 12/1985 | United Kingdom | |

OTHER PUBLICATIONS

"Ground Plane for an A-Tab Package", IBM T.D.B., vol. 30, No. 12, May/88, pp. 176-177.
Holz, "Next-Generation High-Speed Packaging", *MSN & CT,* (1988), 18:32-40.
Hyslop et al., "High Performance Decoupling Capacitor for Installation Under the Dual-In-Line IC Package", 1987, *Proceedings of the 37th Electronic Components Conference,* (Cat. No. 87CH2448-9), (May 1987), pp. 499-455.
Biswas, "A New Concept in Decoupling I.C. Devices", *Sixteenth Annual Connectors and Interconnection Technology Symposium Proceedings,* (Nov. 1983), pp. 203-219.
Intel Corporation, "Multi-Layer Molded High Performance PQFP", 3, Technical Papers, dated 04/27/89, 04/27/89 and 05/24/89, respectively.

*Primary Examiner*—Andrew J. James
*Assistant Examiner*—Viet Q. Nguyen
*Attorney, Agent, or Firm*—Townsend and Townsend

[57] ABSTRACT

A package for an integrated circuit is disclosed. The package includes a lead frame with an overlying dielectric layer. One or more conductive coupons are placed on the dielectric layer and act as multiple inductive paths for the power and ground lines. Decoupling capacitors may be attached between coupons.

9 Claims, 7 Drawing Sheets

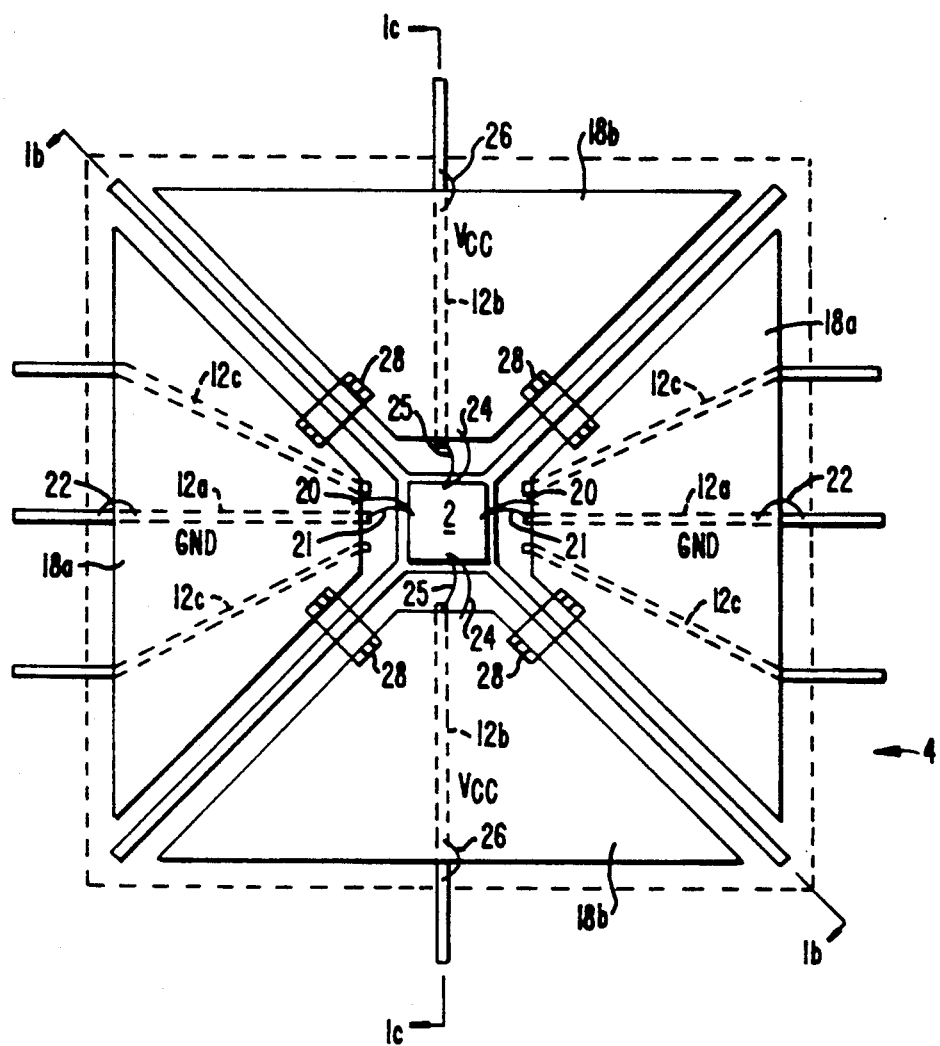
FIG._1a.
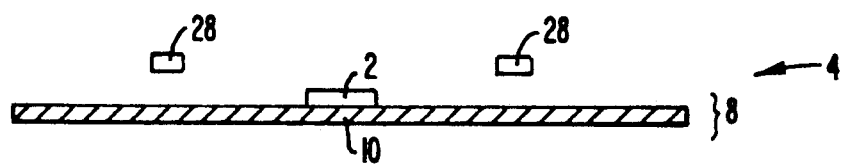
FIG._1b.
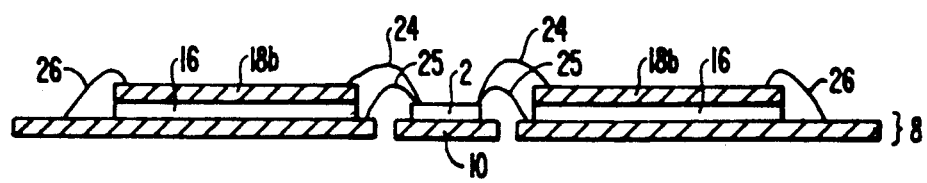
FIG._1c.

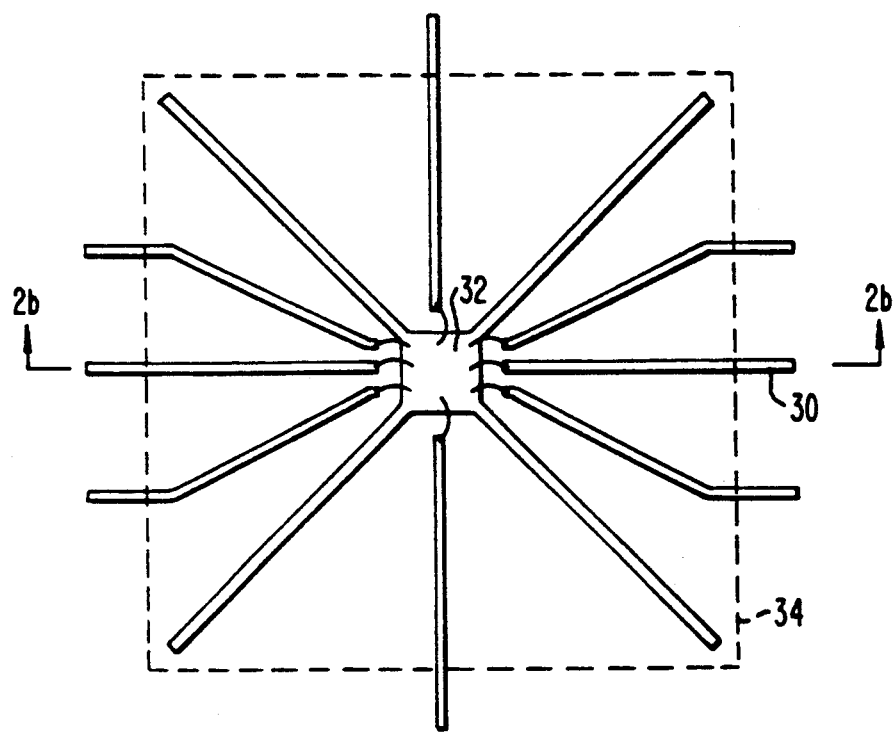
FIG._2a.
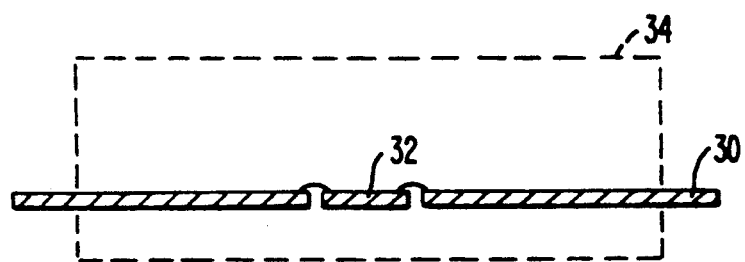
FIG._2b.

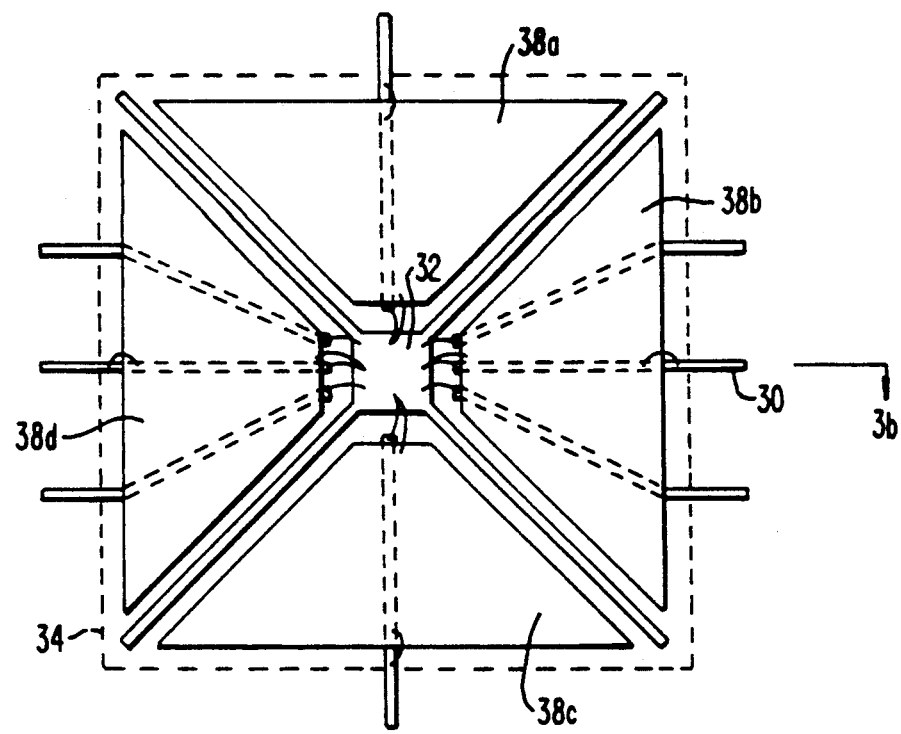
FIG._3a.
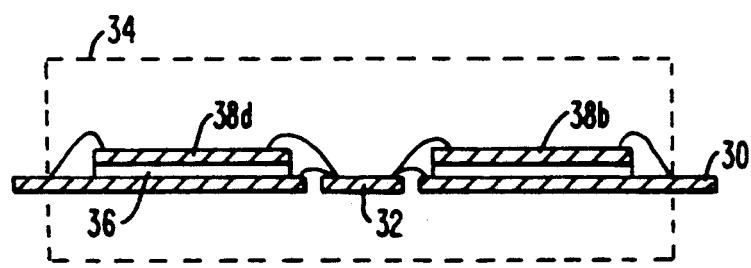
FIG._3b.

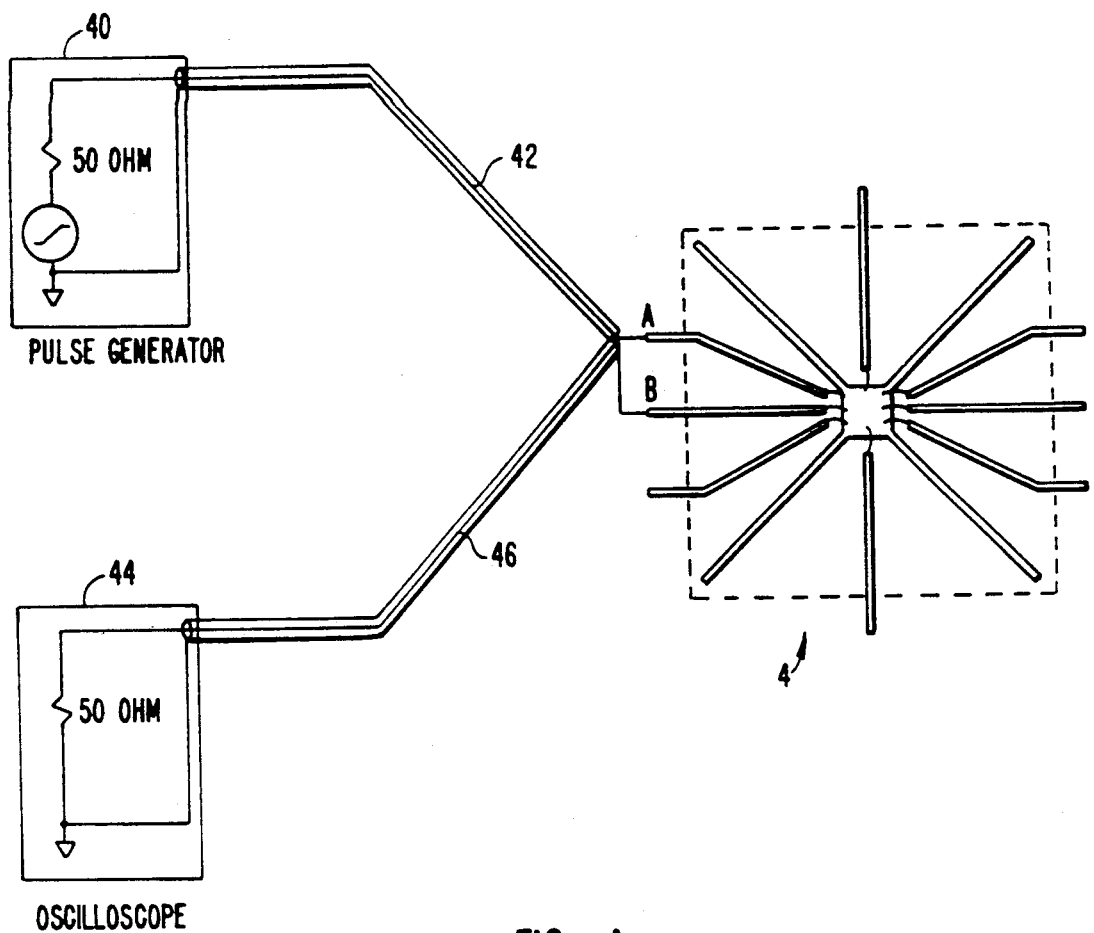
FIG._4.
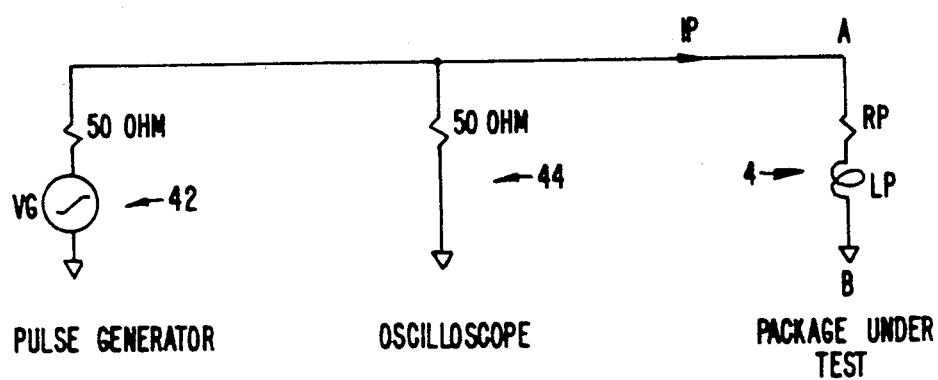
FIG._5.

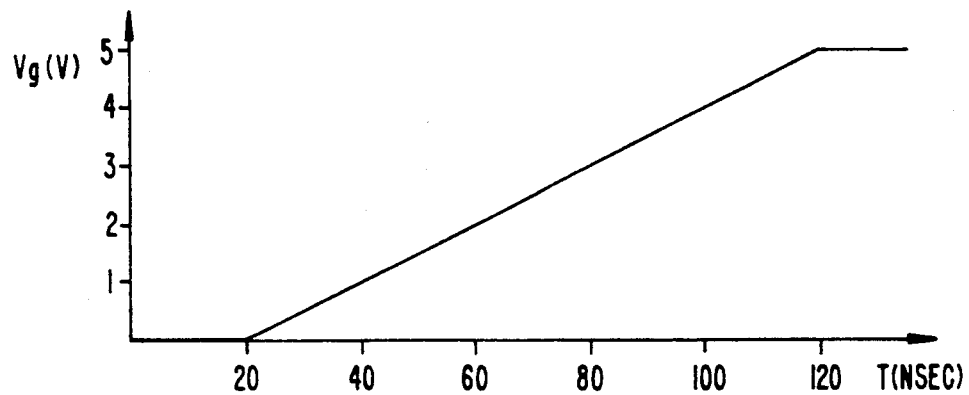
FIG._6.
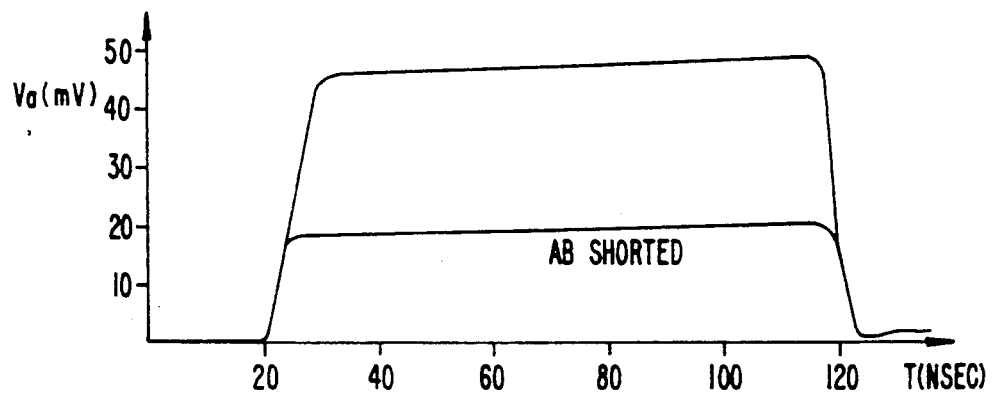
FIG._7.
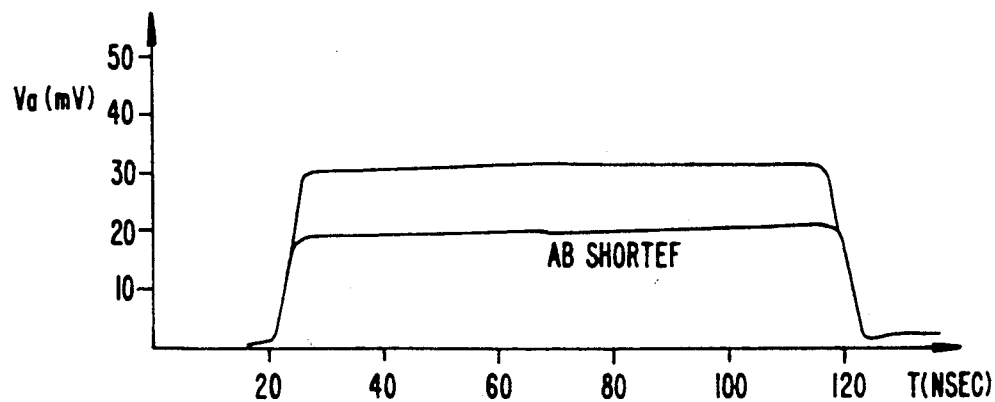
FIG._8.

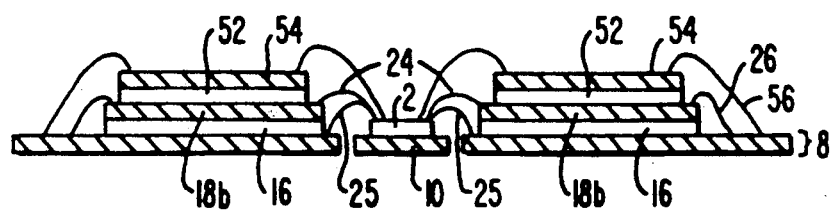
FIG._9.

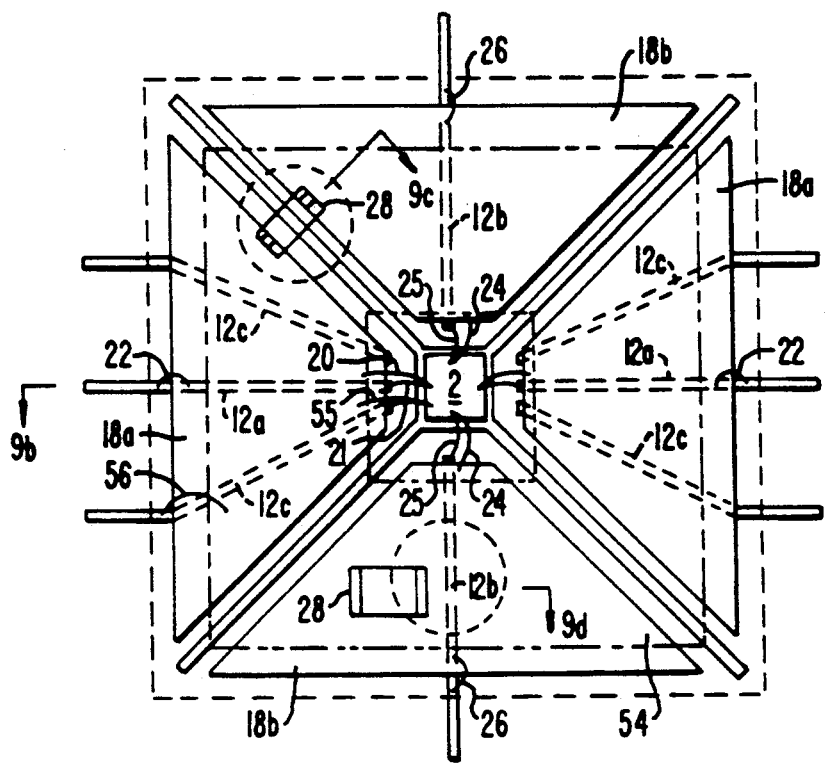
FIG._9a.
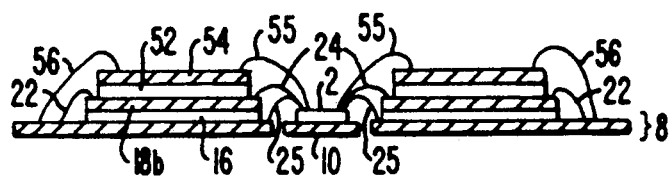
FIG._9b.
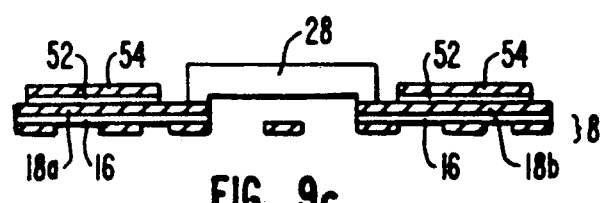
FIG._9c.
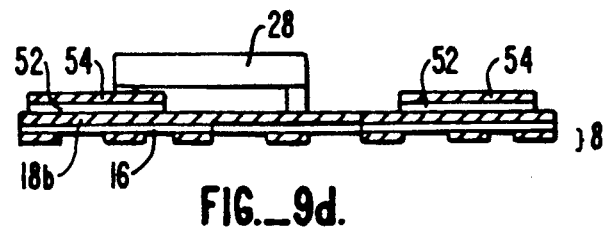
FIG._9d.

LOW IMPEDANCE PACKAGING

BACKGROUND OF THE INVENTION

1. Field of the Invention

The present invention relates to the field of semiconductor devices. More particularly, the present invention provides an improved method and apparatus for reducing impedance in a semiconductor package.

2. In the field of semiconductor device manufacture, it is necessary to provide a connection from an integrated circuit to the "outside world." This function is typically performed by a semiconductor package which may be, for example, a DIP or PLCC which includes 40 or more leads used for signal transmission and power transmission. In addition to transferring signals, power, and the like to the outside world, the package also serves to protect the integrated circuit from environmental effects and provide heat dissipation.

As integrated circuit speeds and packing densities increase, the importance of the packaging technology becomes increasingly significant. For example, as devices approach gigahertz speed, inductance effects and the like in the packaging become significant. Such inductance effects may arise from, for example, switching and the like, and are particularly problematic in power and ground leads. Inductance effects in the package can cause ground bounce, signal cross-talk, and the like. Increasing circuit size and speed also impact the heat dissipation ability of the packaging.

A variety of solutions to inductance problems in integrated circuit packaging have been proposed. For example, Daniels et al., U.S. Pat. No. 4,680,613, disclose a low impedance dual in-line package in which a dielectric layer is provided adjacent a lead frame and a ground plate is provided adjacent the dielectric layer. A ground lead finger is electrically connected in parallel to the ground plate and a decoupling capacitor is provided between the ground plate and a downset tab on the power lead. The integrated circuit rests upon the ground plate and is attached thereto via a die pad of the chip.

The packaging method and apparatus disclosed in Daniels et al. have a number of disadvantages. For example, it becomes necessary to re-tool existing packaging fabrication facilities to manufacture packaging in accord with the devices disclosed in Daniels et al. since the lead frame and the like are non-standard. Further, the decoupling capacitor is placed between the lead frame and the ground plane. Consequently, placement of the decoupling capacitors in the package becomes difficult. Further, there is only one low impedance path in the package disclosed by Daniels et al., whereas at least two low inductance paths are needed for ground and power supply interconnects in integrated circuits.

Other packaging techniques are described in, for example, Hyslop et al., "High Performance Decoupling Capacitor for Installation Under the Dual-In-Line IC Package," *Proceedings of the* 37th Electronic Components Conference (1987), and Biswas, "A New Concept in Decoupling I.C. Devices," *Sixteenth Annual Connectors and Interconnection Technology Symposium Proceedings* (1983).

From the above it is seen that an improved packaging apparatus and method of fabrication thereof is desired.

SUMMARY OF THE INVENTION

An improved integrated circuit package and method of fabrication is disclosed. The method provides for the fabrication of a low impedance package using a conventional lead frame. An improved method for providing decoupling capacitors is also disclosed.

In one embodiment the invention provides for the use of a lead frame having a substantially planar portion and a ground paddle. A dielectric layer is placed over the lead frame and bonds thereto. Thereafter, one or more conductive metal coupons are placed over the dielectric layer by placing such coupons over the dielectric layer or by depositing and etching a metal layer. The coupons are patterned and decoupling capacitors are placed between the coupons.

The method and apparatus provide a semiconductor package which provides multiple low inductance signal and power paths without the need to fabricate an expensive pin grid array. Further, placement of decoupling capacitors is greatly facilitated.

Accordingly, in one embodiment the invention comprises a lead frame, the lead frame comprising a die paddle and a plurality of leads, the die paddle and the plurality of leads lying in substantially a common plane; a first dielectric region adjacent to at least one of the leads; a first conductive region adjacent the first dielectric region; an electrical connection between a first end of the at least one lead and the first conductive region; and an electrical connection between a second end of the at least one lead and said first conductive region.

In one embodiment the package further comprises a second dielectric region adjacent a second of the leads; a second conductive region adjacent the second dielectric region; an electrical connection between a first end of the second lead and the second conductive region; and an electrical connection between a second end of the second lead and the second conductive region. The at least one lead may be a ground lead and the second lead may be a power lead. A decoupling capacitor may also be provided between the first and second conductive plane. The first and second dielectric regions and associated conductive regions are preferably mounted above the lead frame and in substantially the same plane.

BRIEF DESCRIPTION OF THE FIGURES

FIGS. 1a, 1b, and 1c illustrate a chip and package according to one embodiment of the invention in top view and side view.

FIGS. 2a and 2b illustrate prior art packages used for comparison tests.

FIGS. 3a and 3b illustrate the package according to the invention disclosed herein used for comparison tests.

FIG. 4 illustrates the experimental setup used to test the lead frame of the invention.

FIG. 5 illustrates the equivalent circuit of FIG. 4.

FIG. 6 illustrates the applied signal provided by the test equipment.

FIG. 7 illustrates the response of the prior art package.

FIG. 8 illustrates the response of the package using metal coupons.

FIGS. 9, 9a to 9d illustrate a multi-layer package.

DETAILED DESCRIPTION OF THE PREFERRED EMBODIMENTS

FIGS. 1a to 1c schematically illustrate one embodiment of an integrated circuit chip 2 and a package 4 therefore according to one embodiment of the invention, in top view and side view, respectively. FIGs. 1a, 1b, and 1c illustrate a high pin PLCC (plastic leaded chip carrier), but it will be apparent to those of skill in the art that the invention could readily be applied to any one of a variety of lead frame configurations.

A lead frame 8 is provided which includes a central die attach support paddle or support 10 on which a device 2 is mounted and a plurality of leads 12a, 12b, and 12c. Support paddle 10 is, in one embodiment, substantially coplanar or coplanar with the lead frame for easy fabrication with leads 12. By "substantially coplanar" it is intended to mean herein that, for example, the die paddle is in the same plane or fabricated from a common metal layer with the leads and is later punched to a small degree so that it lies in a slightly displaced position from the leads.

In FIG. 1, leads 12a represent ground (GND) leads, while leads 12b represent power leads ($V_{cc}$) and leads 12c represent signal leads. It should be recognized that while FIGS. 1a, 1b, and 1c have been simplified to show only 8 leads for clarity, most packages will contain a substantially greater number of leads from that shown in FIG. 1. For example, many integrated circuit packages will facilitate 20 leads, 40 leads, 84 leads, or more. It should, further, be understood that the organization of the various leads will vary from among packages. Many other arrangements will be apparent to those of skill in the art. For example, in some embodiments, the support paddle could act as a ground connection.

Above the leads 12 a dielectric layer 16 is provided. Dielectric layer 16 may be a laminated plastic, epoxy, polyimide, thermoplastic, or any other non-conductive material. In preferred embodiments, the dielectric layer is about 1 mil to 5 mils thick. Above dielectric layer 16, a plurality of metal coupons 18a and 18b are provided. Coupons 18a serve as low impedance paths for ground lines 12a while the coupons 18b serve as low impedance paths for $V_{cc}$ lines 12b. In a preferred embodiment coupons 18a and 18b are copper, but other conductor materials could also be used. For example, coupons 18 could be made of metal such as gold, silver, tungsten, titanium, aluminum, or their alloys, or metal-embedded polymers, or mixtures thereof. Other materials for coupons 18 will be readily apparent to those of skill in the art.

In the embodiment shown in FIG. 1a, ground connections on the integrated circuit are wire bonded to 5 the ground coupons 18a and ground leads 12a via ground wires 20 and 21, respectively. Further, coupons 18a are connected to the ground leads 12a at their outer edge by way of wires 22. Although not shown in FIG. 1, the invention would work equally well by connecting ground wires 20 to the inner edge of the ground lead rather than an IC ground connection. $V_{cc}$ wires 24 and 25 are used to connect a power connection on the integrated circuit to coupons 18b and power leads 12b, respectively, on an inner side of the package. Wires 26 are used to connect coupons 18b to power leads 12b at the outer edge of the package. Although the invention is illustrated with wire bonds from the lead frame to the conductive coupons, solder beads or conductive epoxy extending through the dielectric layer, beam leads, or the like could be used to connect the lead frame to the conductive coupons. Other means of connecting the lead frame to the conductive coupons will be apparent to those of skill in the art upon review of this disclosure.

Between the $V_{cc}$ coupons 18b and the ground coupons 18a, decoupling capacitors 28 are provided. Decoupling capacitors are preferably ceramic chip capacitors such as a KEMET GR500, although a wide variety of such capacitors may be used. Examples of decoupling capacitors are described in, for example Hyslop et al., "High Performance Decoupling Capacitor For Installation Under The Dual In Line IC Package," IEEE (1987), which is incorporated herein by reference.

The package shown in FIG. 1 provides multiple low inductance paths to the lead frame package with a minimum number of additional fabrication steps, and uses presently available lead frames. Further, attachment of the decoupling capacitors for reduction in switching noise is greatly facilitated, because the attachment point for the capacitors is readily accessible on top of the package. The metal coupons not only act as ground planes of a lead frame, but also shield the signal lines from electromagnetic interference.

EXAMPLE

In order to test the efficacy of the invention, a package with an attached multi-layer conductor coupon (PACC) was compared to a conventional 84-pin PLCC (plastic leaded chip carrier) to determine the reduction of package inductance. FIGS. 2a and 2b schematically illustrate the conventional package in top and side view while FIGS. 3a and 3b schematically illustrate the PACC in top and side view as they were used in the tests. As shown, both the conventional package and the PACC include a plurality of lead traces 30. Although greatly expanded for purposes of illustration in FIGS. 2 and 3, lead traces 30 had a width of 25 mils and a thickness of 15 mils, which is conventional for such lead frames. Although only a few leads are shown in FIGS. 2 and 3, the lead frames contained a total of 84 leads.

The lead traces 30 of both devices were directly wire bonded and, therefore, shorted to a chip paddle 32 in order to simplify measurements. In the device shown in FIG. 3 a dielectric adhesive layer 36 of thermoplastic was provided adjacent the lead frame and conductive coupons 38a, 38b, 38c, and 38d were provided above the dielectric layer 36. Coupons 38 are in the shape of trapezoids for maximum area exposure. In the PACC, the conductor coupon was connected to the inner and outer ends of the leads via wire bonding. As with the conventional device, the package was enclosed in plastic 34.

FIG. 4 illustrates the experimental setup used to test the packages shown in FIGS. 2 and 3. Using this configuration, the round-trip (in and out) inductance can be measured between the outer end of the lead traces A and B.

A pulse generator 40 was used to generate a ramped (i.e., linearly increasing) input signal to the leads via coaxial cables 42. The voltage developed between leads A and B is measured with an oscilloscope 44 via coaxial cable 46. Fifty-ohm resistance was used in both the line 42 leading up to the traces from the pulse generator and the line 46 coming from the traces to the oscilloscope.

The equivalent circuit for the apparatus shown in FIG. 4 is illustrated in FIG. 5. As shown, a generated voltage $V_g$ is applied by the pulse generator, which is a function of time. Specifically, $V_g$ is defined by the equation:

$$V_g = V_0^*(t)/t_r$$

where:
V₀ is magnitude of a ramp voltage;
t is time; and
$t_r$ is rise time.

When $V_g$ is applied, the voltage developed between point A and point B ($V_a$) is defined by the equation:

$$V_a = L_p\left(\frac{d(i_p)}{dt}\right) + R_p(i_p)$$

where:
$L_p$ is the package inductance;
$i_p$ is the current to the package; and
$R_p$ is the package resistance.

Since the resistance in the package is probably much less than 50 ohms, $V_1 << V_g$ and, therefore, the current to the package will be approximately:

$$i_p = V_g/50$$
$$= (V_0/50)(t/t_r)$$

Therefore:

$$V_a = L_p(V_0/50)(1/t_r) + R_p(V_0/50)(t/t_r) = V_a' + V_a''(t/t_r)$$

where:
$V_a'$ is $(L_p^*V_0)/(50^*t_r)$; and
$V_1''$ is $R_p(V_0/50)$.
Therefore:

$$L_p = (V_a'/V_0)(50^*t_r)$$

From the above it is seen that when a ramp input is applied by the signal generator, $V_a$ is the supposition of a DC offset ($V_a'$ due to the inductance) and a ramp ($V_a''$ due to the resistance of the traces). The inductance of $L_p$ can, therefore, be extracted from $V_a'$.

FIG. 6 shows a 5-volt ramp applied to measure $L_p$ in which the rise time $t_r$ is 100 nsec. The voltage measured across the conventional package is shown in FIG. 7. In order to determine the voltage across the package ($V_a$) the voltage is measured both with and without A and B shorted. The difference between the two curves is 28 mv. Therefore, for the PLCC:

$$L_p = (28mv/5 \text{ volt})(50)(100 \times 10^{-9}) = 28 \text{ nh}$$

and the inductance of one trace is $L_p/2$ or 14 nh.

If the test circuit used was ideal, the measured voltage with A and B shorted would be 0 volts. However, a non-zero voltage may be measured when the test circuit itself has an impedance. This parasitic impedance is not shown symbolically in the schematic of FIG. 5, nevertheless it has been accounted for in the calculations of the inductances of the leads in the lead frame, since only the difference between the shorted and the unshorted measurements is considered in the equation above.

The same measurements for the PACC are shown in FIG. 8. In this case:

$$L_p = (13mv/5 \text{ volt})(50)(100 \times 10^{-9}) = 13 \text{ nh}$$

and the inductance of one trace is 6.5 nh. The measurements shown in FIGS. 7 and 8 show that the use of coupons according to the invention reduces the trace inductance of an 84-pin PLCC from 14 nh to 6.5 nh.

An alternative embodiment of the invention is shown in FIGS. 9a to 9d which shows a package in cross-section. In this embodiment, multiple layers of conductor coupons are provided. Similar components are identified by identical reference numerals.

Fabrication of a package in accord with the invention greatly facilitates addition of low impedance planes for additional leads. An additional dielectric layer 52 is provided above the first conductive coupons 18b. An additional conductive coupon(s) 54 is provided above the dielectric layer(s) 52. The additional conductive coupons are wire bonded to, e.g., signal leads on the lead frame 8 at their outer end via wire bonds 56. At the inner edge of the coupon 54, wire bonding is provided to a signal pad on the IC 2. In this multi-conductor configuration, apertures (identified by dashed rings) are opened in the top-most dielectric and conductor regions to provide decoupling capacitors between the metal regions. The decoupling capacitors may then straddle from one layer to another, as shown in FIG. 9d. It is to be understood that while the invention is illustrated with respect to the upper conductive coupon being connected to a signal lead, the second layer of conductive coupons could be attached to any lead including, for example, second power leads, signal leads, or the like.

A method of manufacturing a semiconductor package is also provided herein. Referring again to FIG. 1, a lead frame 8 is provided. Lead frame 8 includes ground paddle 10 and leads 12 in substantially the same plane.

In one embodiment, a thin metal foil is laminated with plastic adhesive layer as dielectric (and any dielectric, preferably plastic, layer when the adhesive layer does not act as dielectric). This laminate is punched into the appropriate forms to form coupons. These laminated coupons are located on the top surface of the lead frame and are cured by heating to complete coupon attachment. Wiring between the die pad and the conductor plane is conducted using a conventional wire bonding technique, although any other technique can be easily used as described earlier.

A conventional plastic package manufacturing process uses steps in sequence such as die bonding, wire bonding, plastic molding, and lead finish. The coupon attachment can be inserted, for example, just before wire bonding after die bonding without changing the conventional package manufacturing process. The coupon attachment can, alternatively, be inserted just before molding if it provides convenient process flow. The process may provide a low impedance package with little or no process change in the existing package manufacturing process and the maximum utilization of the same package manufacturing process steps for coupon attachments. Simultaneous wire bonding of coupon pad to die pads may be provided, for example, with conventional wire bonding between die pads to lead frame pads. Similarly, curing of plastic adhesive of the coupon may be provided with simultaneous curing of the epoxy die attach material typically used in the conventional package manufacturing process.

Thereafter, decoupling capacitors 28 are provided between the coupons by soldering to the coupons.

It is to be understood that the above description is intended to be illustrative and not restrictive. Many embodiments will be apparent to those of skill in the art upon reviewing the above description. The scope of the invention should, therefore, be determined not with reference to the above description, but should instead be determined with reference to the appended claims, along with the full scope of equivalents to which such claims are entitled.

What is claimed is:

1. A low impedance integrated circuit package comprising:
   a) a lead frame, said lead frame comprising a die paddle and a plurality of leads, said die paddle and said plurality of leads lying in substantially a common plane;
   b) a first dielectric region above a first lead, wherein said first lead is chosen from said plurality of leads;
   c) a first conductive region above said first dielectric region;
   d) an electrical connection between a first end of said first lead and said first conductive region;
   e) an electrical connection between a second end of said first lead and said first conductive region;
   f) a second dielectric region above a second lead, wherein said second lead is chosen from said plurality of leads;
   g) a second conductive region above said second dielectric region;
   h) an electrical connection between a first end of said second lead and said second conductive region;
   i) an electrical connection between a second end of said second lead and said second conductive region; and
   j) a decoupling capacitor connected between said first conductive region and said second conductive region.

2. A low impedance package as recited in claim 4, wherein said first lead is a ground lead and said second lead is a power lead.

3. Apparatus as recited in claim 1, wherein said decoupling capacitor is mounted above said first and said second conductive regions.

4. A package as recited in claim 1, wherein said first dielectric region is selected from the group thermoplastic and polyimide.

5. A package as recited in claim 1, wherein said first conductive region is a copper strip.

6. A package as recited in claim 1, wherein said first conductive region is an aluminum strip.

7. A package as recited in c laim 4, wherein said second lead is a ground lead, said first lead is a power lead, and said first and second conductive regions are substantially trapezoidal in shape.

8. A package as recited in claim 7 further comprising third and fourth leads, said third and fourth leads also having adjacent dielectric regions and third and fourth trapezoidal conductive regions, said first, second, third and fourth conductive regions forming a central, rectangular die opening.

9. A package as recited in claim 8 further comprising decoupling capacitors mounted between said first, second, third, and fourth conductive regions.

* * * * *